United States Patent
Morales et al.

[11] Patent Number: 6,140,977
[45] Date of Patent: Oct. 31, 2000

[54] METHOD FOR ATTACHING AN ANTENNA TO A CIRCUIT BOARD AND ARTICLE PRODUCED THEREBY

[75] Inventors: Jorge Morales; Cesar Estrada Avitia; Rodolfo Sotelo Mendoza, all of Chih, Mexico

[73] Assignee: Visteon Global Technologies, Inc., Dearborn, Mich.

[21] Appl. No.: 09/366,221

[22] Filed: Aug. 2, 1999

[51] Int. Cl.[7] .................................................. H01Q 1/50
[52] U.S. Cl. ........................ 343/906; 343/702; 439/916
[58] Field of Search .................................. 343/702, 906, 343/767, 700 MS, 795; 339/17 M, 126 J, 217 J, 14, 18; 29/600; 439/916; 340/825.22, 825.5; H01Q 1/24, 1/50

[56] References Cited

U.S. PATENT DOCUMENTS

| | | |
|---|---|---|
| 3,827,054 | 7/1974 | Herskind . |
| 3,936,120 | 2/1976 | Schultz . |
| 4,063,246 | 12/1977 | Greiser ............................. 343/700 MS |
| 4,725,827 | 2/1988 | Gallegos et al. ........................ 340/696 |
| 4,849,765 | 7/1989 | Marko . |
| 5,164,737 | 11/1992 | Murray et al. . |
| 5,168,280 | 12/1992 | Blaese ..................................... 343/715 |
| 5,235,736 | 8/1993 | Hahs, Jr. et al. . |
| 5,278,571 | 1/1994 | Helfrick ................................... 343/703 |
| 5,469,178 | 11/1995 | Nguyen et al. . |
| 5,539,417 | 7/1996 | Terry et al. .............................. 343/702 |
| 5,739,791 | 4/1998 | Barefield et al. ........................ 343/702 |
| 5,861,854 | 1/1999 | Kawahata et al. . |
| 5,864,751 | 1/1999 | Kazami ................................. 455/161.2 |

Primary Examiner—Tho Phan
Attorney, Agent, or Firm—Leslie C. Hodges

[57] ABSTRACT

An electronic circuit assembly, comprising: a printed circuit board 10 having opposed top and bottom surfaces 12/14 and a circuit board edge 16 thereabout, a slot 18 formed in the circuit board edge (wherein the slot has two opposed longitudinal edges 20 and a transverse edge 22), and a plated through-hole 32 formed through the board adjacent the transverse edge 22; and a generally elongate antenna socket 46 having an outer surface 48 thereof, a female electrical connector 54 formed in an outboard end 52 thereof, and a finger 56 formed in and extending from an inboard end 50 thereof. The antenna socket 46 is disposed so as to rest within the slot 18 on the top circuit board surface 12 with the finger 56 extending through the plated through-hole 32. In a preferred embodiment, at least one first solder joint 58 on the bottom circuit board surface 14 connects a respective one of the longitudinal edges 20 of the slot with the adjacent outer surface 48 of the antenna socket 46, while a second solder joint 60 connects the finger 56 with the plated through-hole 32.

15 Claims, 3 Drawing Sheets

METHOD FOR ATTACHING AN ANTENNA TO A CIRCUIT BOARD AND ARTICLE PRODUCED THEREBY

BACKGROUND OF THE INVENTION

1. Field of the Invention

The present invention relates generally to PCBs (printed circuit boards), and more particularly to a method (and the article produced thereby) for attaching an antenna to a PCB.

2. Disclosure Information

AM/FM radios for automobiles, home audio systems, and the like commonly include a PCB 10 (populated with electronic components 70) and an antenna 38. As illustrated in FIGS. 1–2, the antenna 38 typically includes a telescoping portion 40 with a wire 42 attached thereto, with a plug 44 on the other end of the wire. The plug 44 is inserted into an antenna socket 46 which is attached to the PCB by means of one or more brackets 80, pins 82, fasteners 84, and the like.

Although the foregoing approach is in common use, it would nonetheless be desirable to provide a way of connecting the antenna socket 46 to the PCB 10 without the need for brackets 80 and other related fastening hardware 82/84.

SUMMARY OF THE INVENTION

The present invention overcomes the disadvantages of the prior art approaches by providing an electronic circuit assembly, wherein a preferred embodiment comprises: a printed circuit board having opposed top and bottom surfaces and a circuit board edge thereabout, a slot formed in the circuit board edge (wherein the slot has two opposed longitudinal edges and a transverse edge), and a plated through-hole formed through the board adjacent the transverse edge; and a generally elongate antenna socket having an outer surface thereof, a female electrical connector formed in an outboard end thereof, and a finger formed in and extending from an inboard end thereof. The antenna socket is disposed so as to rest within the slot on the top circuit board surface with the finger extending through the plated through-hole. At least one first solder joint on the bottom circuit board surface connects a respective longitudinal edge of the slot with the outer surface of the antenna socket, while a second solder joint connects the finger with the plated through-hole. The first and second solder joints in this preferred embodiment are preferably formed using a conventional wave soldering process.

It is an object and advantage that the present invention eliminates the need for brackets and related fastening hardware in connecting an antenna socket to a PCB.

Another object and advantage is that the present invention may be implemented using existing PCBs, antenna sockets, and solder processing with only minor modification to the PCB.

Yet another object and advantage is that the present invention significantly reduces overall material and labor costs associated with the manufacture of radio PCBs.

A further object and advantage is that the present invention may be produced by either wave soldering or reflow soldering.

These and other advantages, features and objects of the invention will become apparent from the drawings, detailed description and claims which follow.

DETAILED DESCRIPTION OF THE PREFERRED EMBODIMENTS

Figure 1:
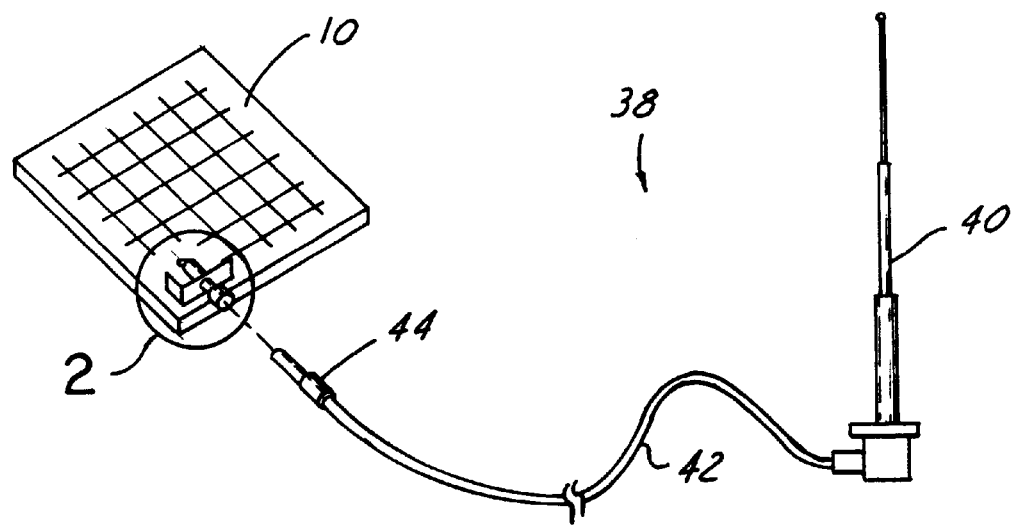
FIG. 1 is an exploded perspective view of a radio PCB/antenna system according to the prior art.
Figure 2:
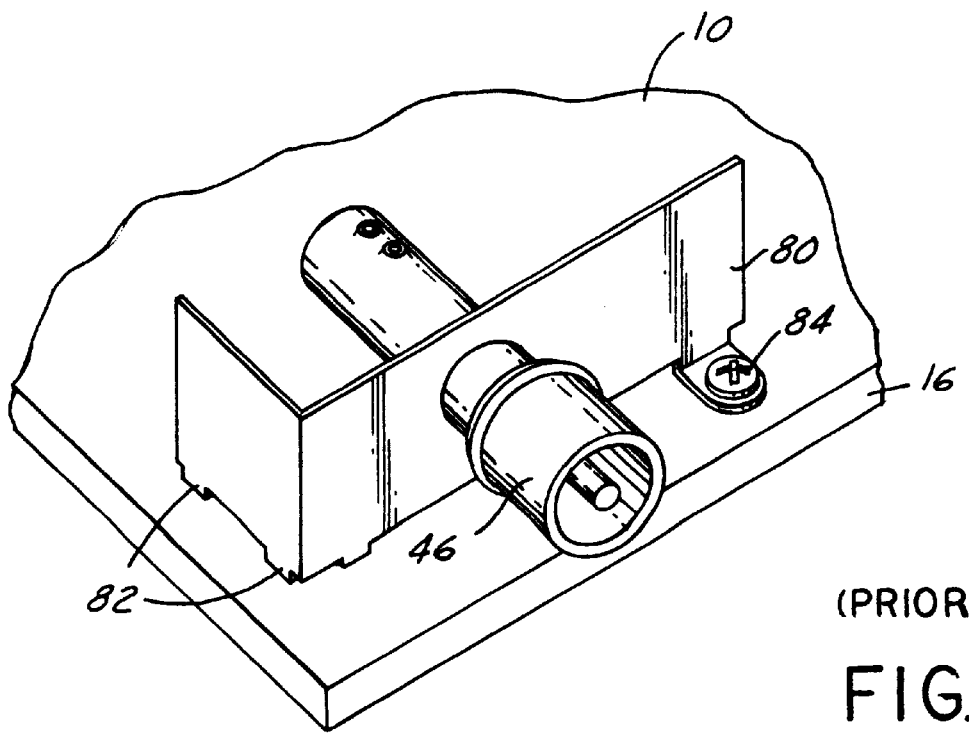
FIG. 2 is a close-up, perspective view of the PCB with attached antenna socket shown in FIG. 1.

Referring now to the drawings, FIGS. 3–8 show various representations of an electronic circuit assembly according to the present invention. A preferred embodiment of the invention comprises: (1) a printed circuit board 10 having opposed top and bottom surfaces 12/14 and a circuit board edge 16 thereabout, a slot 18 of width W1 formed in the circuit board edge 16 (wherein the slot has two opposed longitudinal edges 20 generally orthogonal to the circuit board edge and a transverse edge 22 bridging the longitudinal edges), and a plated through-hole (PTH) 32 formed through the PCB adjacent the transverse slot edge 22; and (2) a generally elongate antenna socket 46 having an outer surface 48 thereof, a female electrical connector 54 formed in an outboard end 52 thereof, and a finger 56 formed in and extending from an inboard end 50 thereof, wherein the inboard end has a width W2 less than W1. The antenna socket 46 is disposed on the top surface of the PCB within the slot 18 with the finger 56 extending through the plated through-hole 32, with at least one first solder joint 58 on the top or bottom surface 12/14 connecting a respective one of the longitudinal slot edges 20 with the outer surface 48 of the antenna socket 46, and a second solder joint 60 connecting the finger 56 with the plated through-hole 32.

Figure 3:
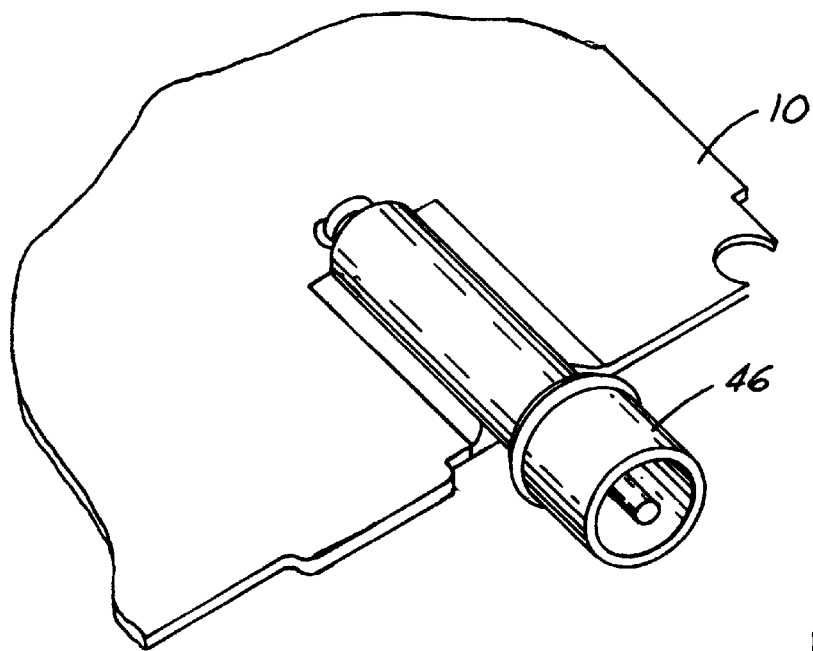
FIG. 3 is a perspective, underside view of an electronic circuit assembly according to the present invention.
Figure 4:
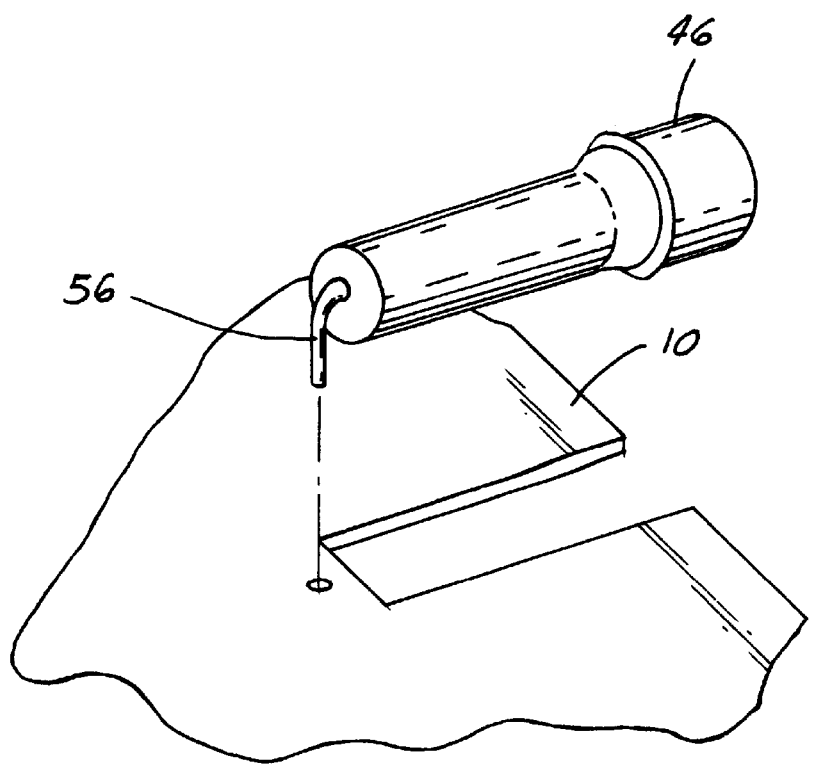
FIG. 4 is an exploded reverse-angle view of the electronic circuit assembly shown in FIG. 3.
Figure 5:
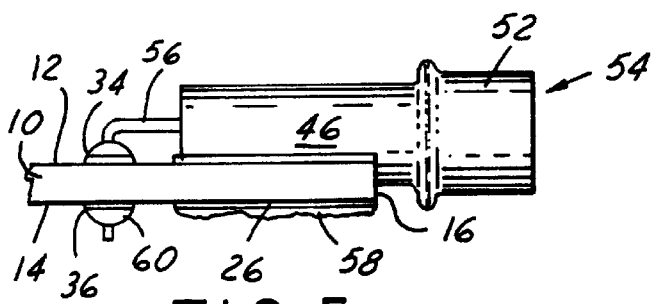
FIG. 5 is a side view of the electronic circuit assembly shown in FIG. 3.
Figure 8:
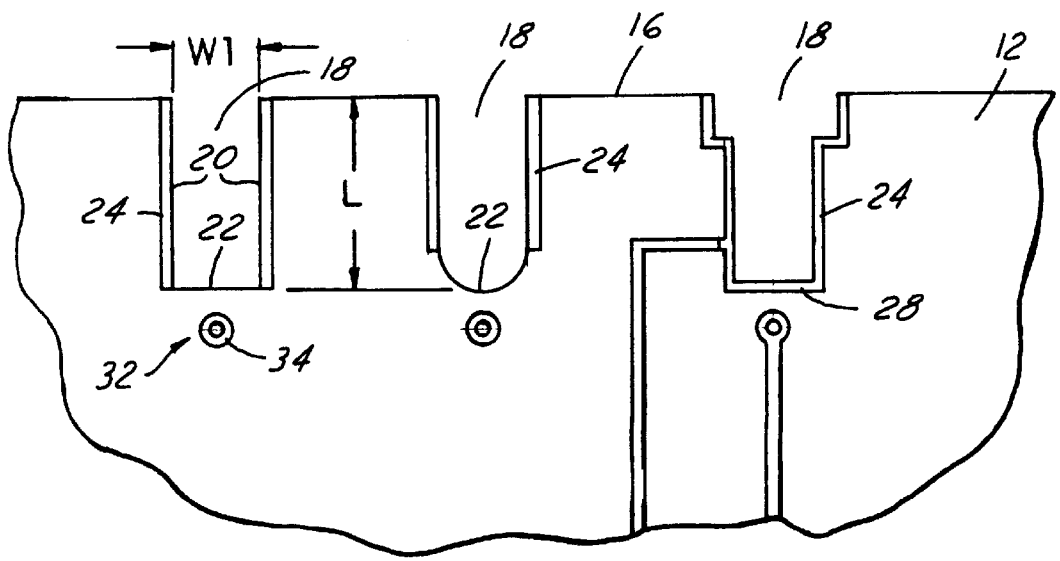
FIG. 8 is a top view of a PCB showing various edge-slot configurations for use with the present invention.

To assist the reader in understanding the present invention, all reference numbers used herein are summarized in the table below, along with the elements they represent:

10=PCB
12=Top side of PCB
14=Bottom (wave-solderable) side of PCB
16=Edge of PCB
18=Slot formed in PCB edge
20=Longitudinal edge of slot
22=Transverse edge of slot
24=Longitudinal solder land area on top side
26=Longitudinal solder land area on bottom side
28=Transverse solder land area on top side
30=Transverse solder land area on bottom side
32=PTH adjacent transverse edge
34=PTH solder land area on top side
36=PTH solder land area on bottom side
38=Antenna
40=Telescoping portion of antenna
42=Wire between telescoping portion and socket
44=Plug on wire which plugs into socket
46=Antenna socket
48=Outer surface of socket
50=Inboard end/inboard portion of socket
52=Outboard end/outboard portion of socket
54=Female feature formed in outboard end 56=Finger formed in inboard end
58=First solder joint (socket-to-slot edges)
60=Second solder joint (finger-to-PTH)
70=Electronic components
80=Bracket
82=Pin for attaching bracket to PCB
84=Fastener for attaching bracket to PCB
L=Length of slot
W1=Width of slot
W2=Width/diameter of inboard end of socket As illustrated in FIGS. 3, 4, and 8, the slot 18 is formed in the edge 16 of the PCB 10, with the PTH 32 being located proximate the transverse slot edge 22 (which is also the slot edge most distal from the PCB edge 16). Although the preferred slot shape is rectangular, it may also be generally bullet-shaped or T-shaped, as shown in FIG. 8, or any other suitable shape. Typically, the slot shape will generally conform with the shape of the inboard end 50 of the antenna socket 46, but with the slot width W1 being narrower than the socket width W2 at all points along the length L of the slot. With this arrangement, the inboard end 50 of the antenna socket may be disposed snugly within and atop the slot 18, and the PCB 10 then sent through a wave soldering process with the bottom side 14 of the board down. As the PCB is passed across the molten solder during the wave soldering process, the molten solder will wet onto the longitudinal solder land area 26 on the bottom board side 14 (located immediately adjacent the longitudinal slot edge 20) and onto the nearby socket exterior 48 to form a first solder joint 58 therebetween. At the same time, a second solder joint 60 will be formed connecting the PTH 32 with the finger 56 (which preferably extends through the board past the bottom side, as in FIG. 5).

The invention requires there to be a minimum of one longitudinal solder land 26 on the PCB bottom side 14, but preferably each of the two longitudinal slot edges 20 has its own respective longitudinal solder land 26 therealong. Also, although the solder lands 26/36 only have to be on the bottom side 14 of the board 10 (for wave soldering), the most practical and common approach will be to have the slot edges 20 and through-hole 32 completely plated through the depth/thickness of the board, and even slightly onto the top side 12, as illustrated in FIGS. 3–7. As another option, the transverse edge 22 of the slot 18 may also be plated so as to provide a transverse solder land 30 on at least the bottom side 14, but preferably also through the board thickness and onto the top side 28 as well. The transverse lands 28/30 may be contiguous with one or both of the longitudinal lands 24/26 on the respective board side 12/14, or may be separate therefrom.

Figure 6:
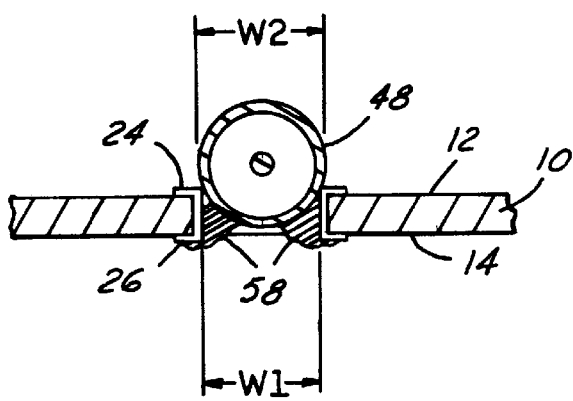
FIGS. 6–7 are end-section views of the present invention processed using wave soldering and reflow soldering, respectively.
Figure 7:
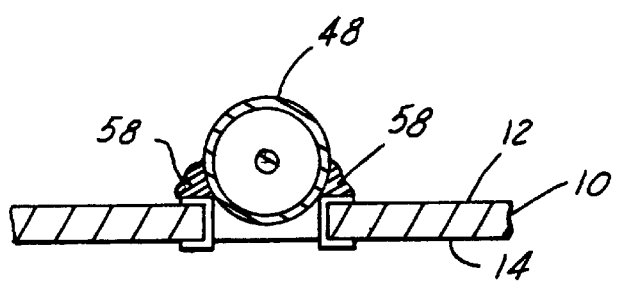

The antenna socket 46 used in the present invention is the same as that used in prior art applications; thus, no special antenna socket is required. The typical socket 46 is a generally elongate metallic element whose outer surface is solder-wettable. The typical shape is generally tubular, although other shapes are acceptable. As illustrated in FIGS. 3, 6 and 7, one end 52 of the socket is adapted to provide a jack or female electrical connector feature 54 therein, with the other end 50 being adapted to provide a finger-like male projection 56 extending outward therefrom. Typically, the socket 46 is constructed such that an outer/tubular portion thereof is electrically insulated from an inner/axial portion thereof; when the plug 44 is plugged into the female portion 54 of the antenna socket 46, the outer/tubular and inner/axial portions each become electrically connected with corresponding portions of the plug. The inner/axial portion runs through the socket and extends out the inboard end 50 of the socket to become the finger 56, all the while being electrically insulated from the surrounding outer/tubular shell. In the final PCB assembly, the finger 56 is soldered to the PTH 32 and the outer/tubular shell is soldered to the solder lands 24/26.

Although it is preferred that the present invention be manufactured using wave soldering as illustrated in FIG. 6, it is also possible to make the present invention using solder reflow processing as illustrated in FIG. 7. In wave soldering, the PCB 10 is floated across molten solder and the solder joints 58 form generally underneath the antenna socket 46 within the slot 18 (see FIG. 6), whereas in reflow soldering, solder paste is deposited (e.g., by screenprinting) on the top solder lands 24 and the PCB is passed through a reflow oven so as to melt the solder paste and form joints 58 that are situated generally atop the PCB top surface 12 (see FIG. 7). If only reflow processing is to be used (i.e., no wave soldering), then it may be desirable to form the finger 56 as a surface mount element that does not necessarily extend through a PTH, but which may rest on a mounting pad atop the PCB (located where the top of the PTH would otherwise be situated).

Various other modifications to the present invention may occur to those skilled in the art to which the present invention pertains. For example, although each longitudinal solder land 24/26 has been illustrated in the drawings as being a single land running along the length of the slot, it is possible to place multiple smaller lands (rather than one long land) along each longitudinal edge. Also, it may be desirable to include "solder thieves" or other common soldering-related features on the PCB adjacent the slot 18. Other modifications not explicitly mentioned herein are also possible and within the scope of the present invention. It is the following claims, including all equivalents, which define the scope of the present invention.

What is claimed is:

1. An electronic circuit assembly, comprising:
    (a) a printed circuit board having
        (1) opposed top and bottom surfaces and a circuit board edge thereabout;
        (2) a slot of width W1 formed in said circuit board edge, wherein said slot has two opposed longitudinal edges generally orthogonal to said circuit board edge and a transverse edge bridging said longitudinal edges; and
        (3) a plated through-hole formed therethrough adjacent said transverse edge;
    (b) a generally elongate antenna socket having an outer surface thereof, a female electrical connector formed in an outboard end thereof, and a finger formed in and extending from an inboard end thereof, wherein said inboard end has a width W2 less than W1;
    (c) said antenna socket resting on said top surface within said slot with said finger extending through said plated through-hole;
    (d) at least one first solder joint connecting a respective one of said longitudinal edges of said slot with said outer surface of said antenna socket; and
    (e) a second solder joint connecting said finger with said plated through-hole.

2. An electronic circuit assembly according to claim 1, wherein said slot is generally rectangular, generally bullet-shaped, or generally T-shaped.

3. An electronic circuit assembly according to claim 1, wherein said slot has a length L as measured from said circuit board edge to said transverse edge, wherein L>W1.

4. An electronic circuit assembly according to claim 1, wherein said finger is bent such that a distal end thereof extends generally orthogonal to a longitudinal axis of said antenna socket.

5. An electronic circuit assembly according to claim 1, wherein each of said at least one first solder joint is disposed on said bottom surface of said circuit board.

6. An electronic circuit assembly according to claim 1, wherein each of said at least one first solder joint is disposed on said top surface of said circuit board.

7. An electronic circuit assembly according to claim 1, further including a longitudinal solder land disposed on at least one of said top and bottom surfaces immediately proximate and along at least one of said longitudinal edges of said slot.

8. An electronic circuit assembly, comprising:
(a) a printed circuit board having
   (1) opposed top and bottom surfaces and a circuit board edge thereabout;
   (2) a generally rectangular slot of length L and width W1 formed in said circuit board edge, wherein said slot has two opposed longitudinal edges generally orthogonal to said circuit board edge and a transverse edge bridging said longitudinal edges, wherein L>W1; and
   (3) a plated through-hole formed therethrough adjacent said transverse edge;
(b) a generally elongate antenna socket having an outer surface thereof, a female electrical connector formed in an outboard end thereof, and a finger formed in and extending from an inboard end thereof, said finger having a distal end thereof bent generally orthogonal to a longitudinal axis of said antenna socket, wherein said inboard end has a width W2 less than W1;
(c) said antenna socket resting on said top surface within said slot with said distal end of said finger extending through said plated through-hole;
(d) two first solder joints on said bottom surface each connecting a respective one of said longitudinal edges of said slot with said outer surface of said antenna socket; and
(e) a second solder joint connecting said finger with said plated through-hole.

9. An electronic circuit assembly according to claim 8, further including a longitudinal solder land disposed on at least said bottom surface immediately proximate and along each of said longitudinal edges of said slot.

10. A method for assembling an electronic circuit assembly, comprising the steps of:

providing a printed circuit board and an antenna socket, wherein the printed circuit board has opposed top and bottom surfaces, a circuit board edge thereabout, a slot of width W1 and having longitudinal edges formed in the circuit board edge, and a plated through-hole formed therethrough adjacent the slot, and wherein the antenna socket has an outer surface, a female electrical connector formed in an outboard end thereof, and a finger formed in and extending from an inboard end thereof, wherein the inboard end of the antenna socket has a width W2 less than W1;

positioning the antenna socket on the top surface of the printed circuit board within the slot with the finger extending through the plated through-hole, thereby forming a circuit board assembly; and processing the circuit board assembly so as to form at least one first solder joint on at least one of the top and bottom surfaces so as to connect a respective one of the longitudinal edges of the slot with the outer surface of the antenna socket, and a second solder joint connecting the finger with the plated through-hole.

11. A method according to claim 10, wherein said processing step comprises wave soldering.

12. A method according to claim 11, wherein the at least one first solder joint is disposed on the bottom surface of the printed circuit board.

13. A method according to claim 10, wherein said processing step comprises reflow soldering.

14. A method according to claim 13, wherein the at least one first solder joint is disposed on the top surface of the printed circuit board.

15. A method according to claim 13, further comprising the step of placing a deposit of solder paste on the top surface of the printed circuit board immediately proximate and along at least one of said longitudinal edges of said slot.

* * * * *